US012211778B2

(12) United States Patent
Apale et al.

(10) Patent No.: US 12,211,778 B2
(45) Date of Patent: Jan. 28, 2025

(54) SEMICONDUCTOR DEVICE AND METHOD OF FORMING BUMP PAD ARRAY ON SUBSTRATE FOR GROUND CONNECTION FOR HEAT SINK/SHIELDING STRUCTURE

(71) Applicant: STATS ChipPAC Pte. Ltd., Singapore (SG)

(72) Inventors: Hermes T. Apale, Shrewsbury, MA (US); KyuWon Lee, Kyunggi-do (KR); Mark Sackett, Chandler, AZ (US)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 18/321,391

(22) Filed: May 22, 2023

(65) Prior Publication Data

US 2023/0307335 A1    Sep. 28, 2023

Related U.S. Application Data

(63) Continuation of application No. 17/445,469, filed on Aug. 19, 2021, now Pat. No. 11,764,136.

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4853* (2013.01); *H01L 23/367* (2013.01);
(Continued)

(58) Field of Classification Search
None
See application file for complete search history.

(56) References Cited

U.S. PATENT DOCUMENTS 6,956,285 B2 * 10/2005 Radu .................... H01L 23/552
257/713
9,601,461 B2 * 3/2017 Ho ....................... H01L 23/3121
(Continued)

FOREIGN PATENT DOCUMENTS

CN    108292645 A    7/2018
CN    109390324 A    2/2019
(Continued)

*Primary Examiner* — Long Pham
(74) *Attorney, Agent, or Firm* — Robert D. Atkins; PATENT LAW GROUP (57) ABSTRACT

A semiconductor device has a substrate and plurality of first bumps formed over the substrate in an array. An array of second bumps is formed over the substrate on at least two sides of the first bumps. An electrical component is disposed over the first bumps. A package structure is disposed over the substrate and electrical component. The package structure has a horizontal member and legs extending from the horizontal member to form a cavity. The package structure is coupled to the array of second bumps. The package structure includes a material to operate as a heat sink or shielding layer. The shielding layer makes ground connection through the array of second bumps. The first bumps and second bumps have a similar height and width to form in the same manufacturing step. A protective layer, such as conductive epoxy, is disposed over the array of second bumps.

31 Claims, 9 Drawing Sheets

(51) Int. Cl.
  *H01L 23/00* (2006.01)
  *H01L 23/367* (2006.01)
  *H01L 23/552* (2006.01)

(52) U.S. Cl.
  CPC ...... *H01L 23/49822* (2013.01); *H01L 23/552* (2013.01); *H01L 24/16* (2013.01); *H01L 2224/16227* (2013.01)

(56) References Cited

U.S. PATENT DOCUMENTS

| | | | |
|---|---|---|---|
| 2014/0124907 A1* | 5/2014 | Park | H01L 23/552 |
| | | | 257/659 |
| 2017/0047308 A1* | 2/2017 | Ho | H01L 23/5386 |
| 2017/0179041 A1 | 6/2017 | Dias et al. | |
| 2019/0051611 A1 | 2/2019 | Kim et al. | |
| 2021/0066151 A1 | 3/2021 | Hu et al. | |
| 2023/0114892 A1* | 4/2023 | Kim | H01L 21/561 |
| | | | 257/659 |

FOREIGN PATENT DOCUMENTS

| CN | 109390324 A1 | 2/2019 |
|---|---|---|
| CN | 112447701 A | 3/2021 |

\* cited by examiner

SEMICONDUCTOR DEVICE AND METHOD OF FORMING BUMP PAD ARRAY ON SUBSTRATE FOR GROUND CONNECTION FOR HEAT SINK/SHIELDING STRUCTURE

CLAIM TO DOMESTIC PRIORITY

The present application is a continuation of U.S. patent application Ser. No. 17/445,469, U.S. Pat. No. 11,764,136, filed Aug. 19, 2021, which application is incorporated herein by reference.

FIELD OF THE INVENTION

The present invention relates in general to semiconductor devices and, more particularly, to a semiconductor device and method of forming a bump pad array on a substrate for ground connection of a heat sink/shielding structure.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications such as radio frequency (RF) wireless communications, often contain one or more integrated passive devices (IPDs) to perform necessary electrical functions. The IPDs are susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Multiple semiconductor die and discrete IPDs can be integrated for higher density in a small space and extended electrical functionality. The semiconductor die and discrete IPDs are mounted to a substrate with die bumps for structural support and electrical interconnect. An encapsulant is deposited over the semiconductor die, discrete IPDs, and substrate. A shielding layer is formed over the encapsulant to isolate sensitive circuits. The shielding layer needs to make a ground connection to the substrate to shunt away charges and effectively reduce RFI/EMI.

The ground connection between the shielding layer and substrate can be conductive paste or conductive epoxy with a ground bump on a ground pad. The conductive paste and ground bump are needed for ground connection for the shielding layer and to prevent oxidation. The ground bump is typically much larger than the die bump. Accordingly, the ground bump cannot be made with the die bump, and vice versa. The difference in height and width of the die bumps and the ground bumps requires different bump formation steps, e.g., a first bumping process for the die bumps and a second bumping process for the ground bumps. The conductive paste and bump material require more manufacturing steps, in addition to formation of the die bumps to electrically connect the semiconductor die. The additional manufacturing steps add cost and the opportunity to introduce defects in the manufacturing process. In addition, the difference in height and width of the die bumps and the ground bumps can form voids and leaving the shielding layer in a slanted or tilted state.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
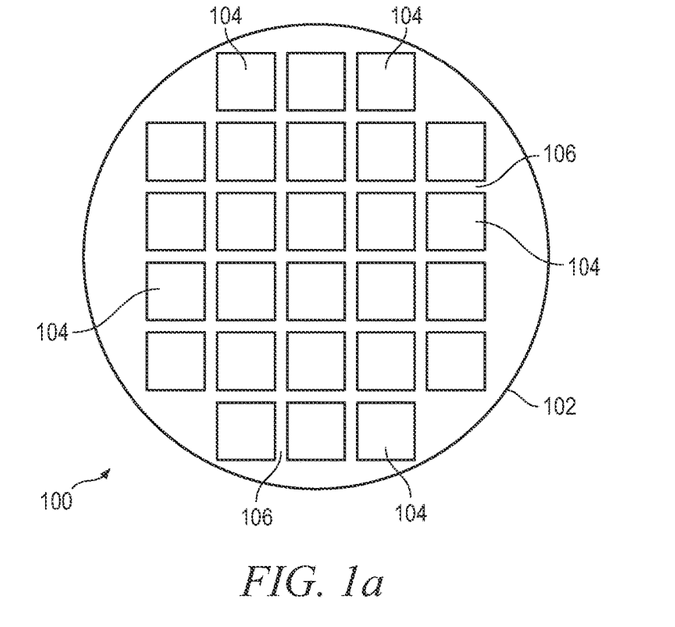
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
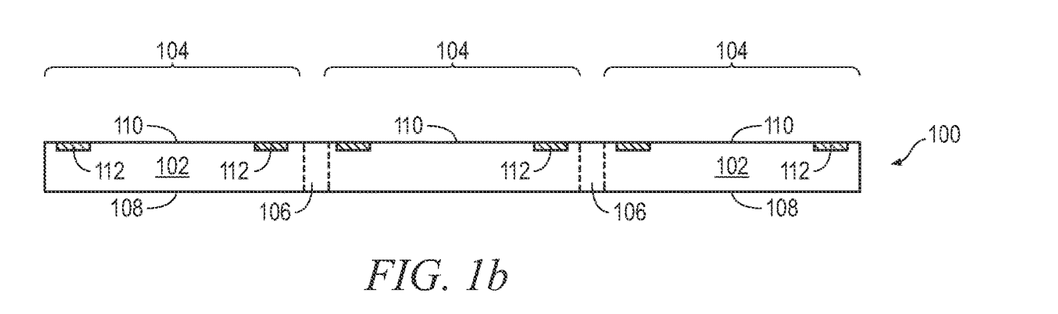

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), power amplifier, application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
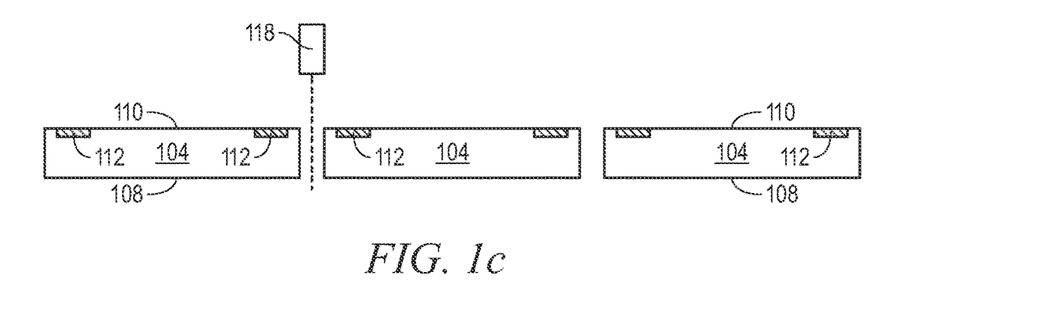

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
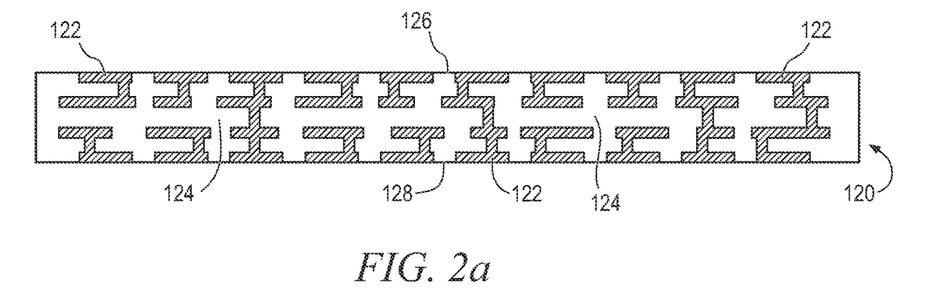
FIGS. 2a-2k illustrate a process of forming a bump pad array on a substrate for ground connection of a heat sink/shielding structure.

FIGS. 2a-2k illustrate a process of forming a bump pad array on a substrate for ground connection of a heat sink/shielding structure. FIG. 2a shows a cross-sectional view of interconnect substrate or PCB 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide ($SiO_2$), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

Figure 2B:
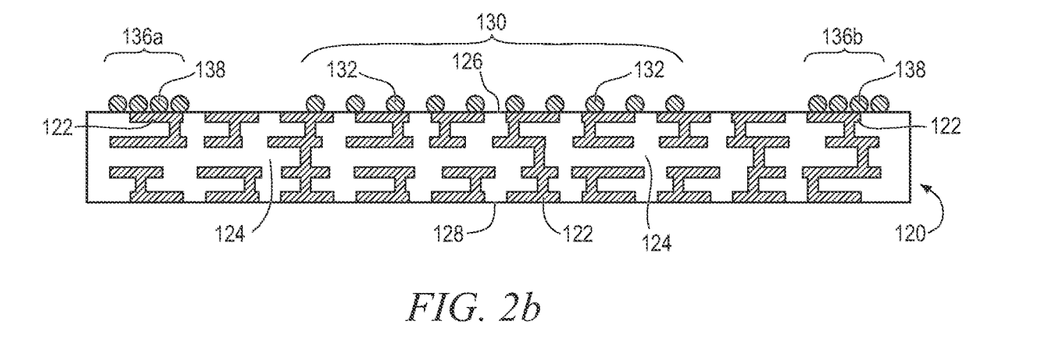

In FIG. 2b, an electrically conductive bump material is deposited over conductive layer 122 on surface 126 of interconnect substrate 120 within component attach area 130 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 132. In one embodiment, bump 132 is formed over an under bump metallization (UBM) having a wetting layer, barrier layer, and adhesive layer. Bump 132 can also be compression bonded or thermocompression bonded to conductive layer 122. Bump 132 represents one type of interconnect structure that can be formed over conductive layer 122. The interconnect structure can also use stud bump, micro bump, or other electrical interconnect.

In a similar manner, an electrically conductive bump material is deposited over conductive layer 122 on surface 126 of interconnect substrate 120 within ground pad array areas 136a-136b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 138. In one embodiment, bump 138 is formed over a UBM having a wetting layer, barrier layer, and adhesive layer. Bump 138 can also be compression bonded or thermocompression bonded to conductive layer 122. Bump 138 represents one type of interconnect structure that can be formed over conductive layer 122. The interconnect structure can also use stud bump, micro bump, or other electrical interconnect.

Figure 2C:
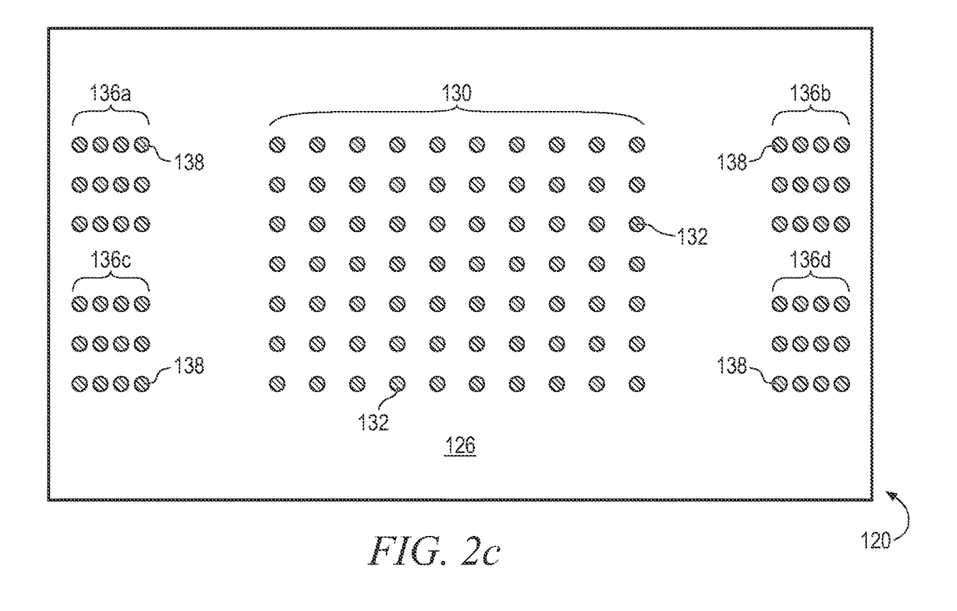

Bumps 132 in component attach area 130 are arranged in an array, as shown in FIG. 2c, to accommodate and make electrical interconnect with an electrical component. Bumps 132 in component attach area 130 have a height and width to accommodate and make electrical interconnect with the electrical component. In one embodiment, bumps 132 has a height above surface 126 of 5-30 micrometers (μm) and width of 20-120 μm so the manufacturing process can use one stencil and one SOP process for both component attach area 130 and ground pad arrays 136a-136d. Bumps 138 on ground pad arrays 136a-136d are arranged in a two-dimensional array, as shown in FIG. 2c, to provide ground connection for a later-formed shielding layer. In particular, the two-dimensional array (X, Y) of bumps 138 on ground pad arrays 136a-136d have N1 number of bumps in the X-direction and N2 number of bumps in the Y-direction. For example, the two-dimensional array of bumps 138 on ground pad arrays 136a-136d can be N1=4 and N2=3 or 4×3 array of bumps. Alternatively, the number of bumps 138 on ground pad arrays 136a-136d can be any value of N1 and N2.

Figure 2D:
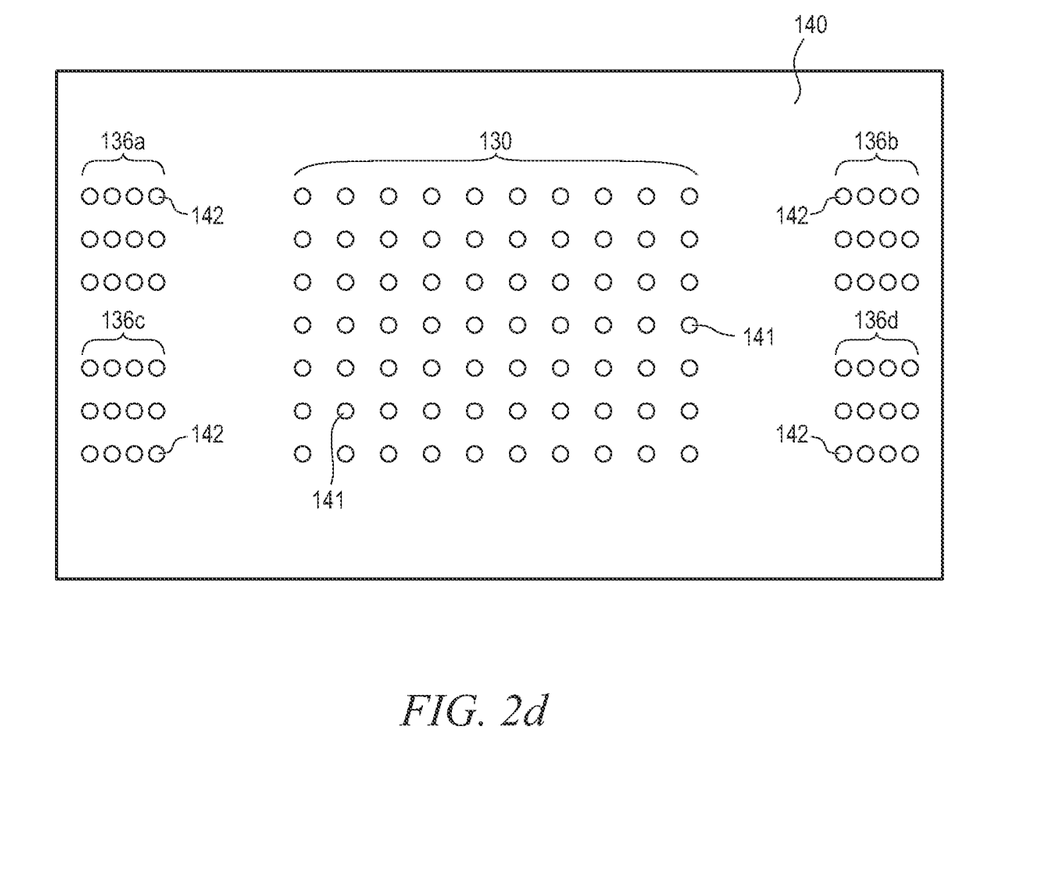

Bumps 138 on ground pad arrays 136a-136d have a height and width to accommodate and make electrical interconnect with a shielding layer. In one embodiment, bump 138 has the same height above surface 126 and width as bump 132, i.e. a height above surface 126 of 5-30 μm and width of 20-120 μm so the manufacturing process can use one stencil and one SOP process for both component attach area 130 and ground pad arrays 136a-136d. The process of making bumps 132 and 138 the same height and width simplifies the process of forming the bumps on surface 126 of interconnect substrate 120. Bumps 132 and bumps 138 can be formed at the same time by the same step with the same processing equipment, e.g., bumps 132 and 138 can be made with one print stencil 140 having a substrate with openings 141, 142 for each of bumps 132 and 138, respectively. FIG. 2d shows print stencil 140 with openings 141 aligned with component attach area 130 in FIG. 2c and openings 142 aligned with ground pad arrays 136a-136d in FIG. 2c. Bumps 132 and 138 can be formed at the same time using the same equipment, i.e., all bumps formed at the same time through openings 141 and 142 in print stencil 140. The process of forming bumps 132 and 138 simultaneously reduces manufacturing costs and simplifies the manufacturing process.

Figure 2E:
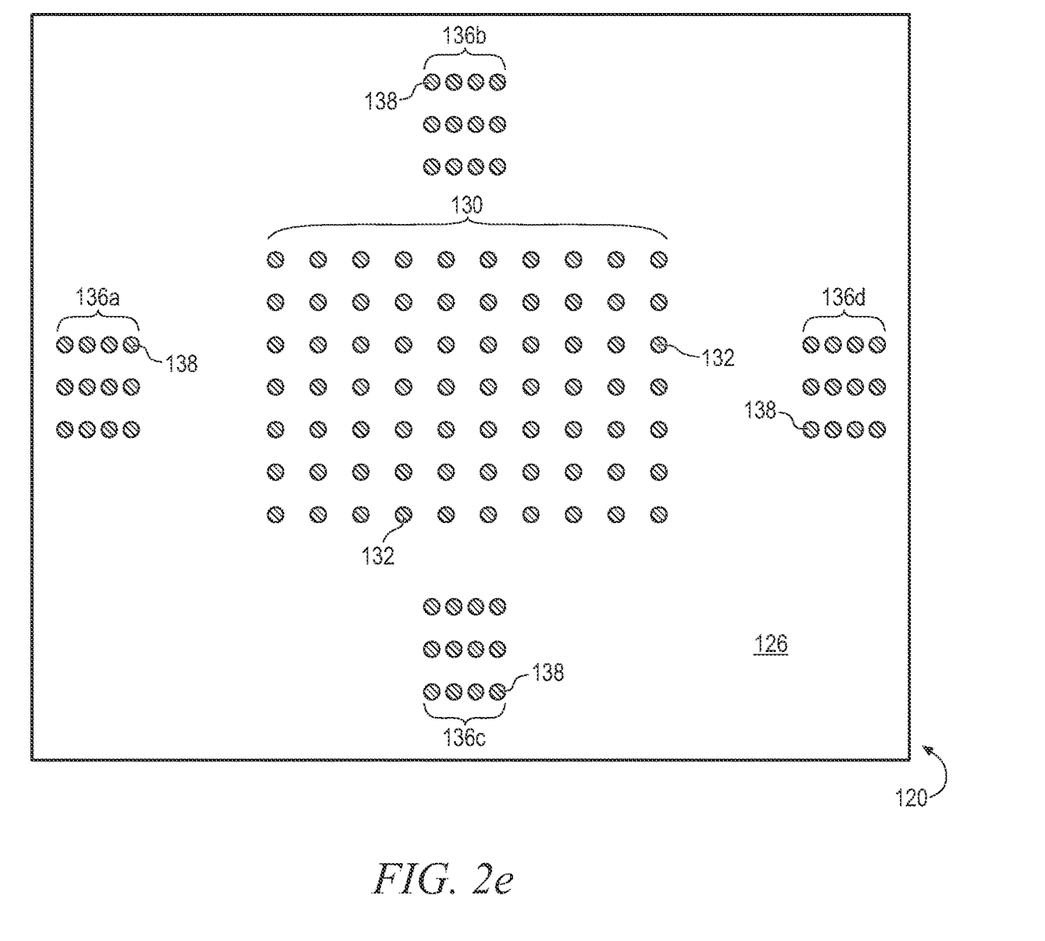
Figure 2F:
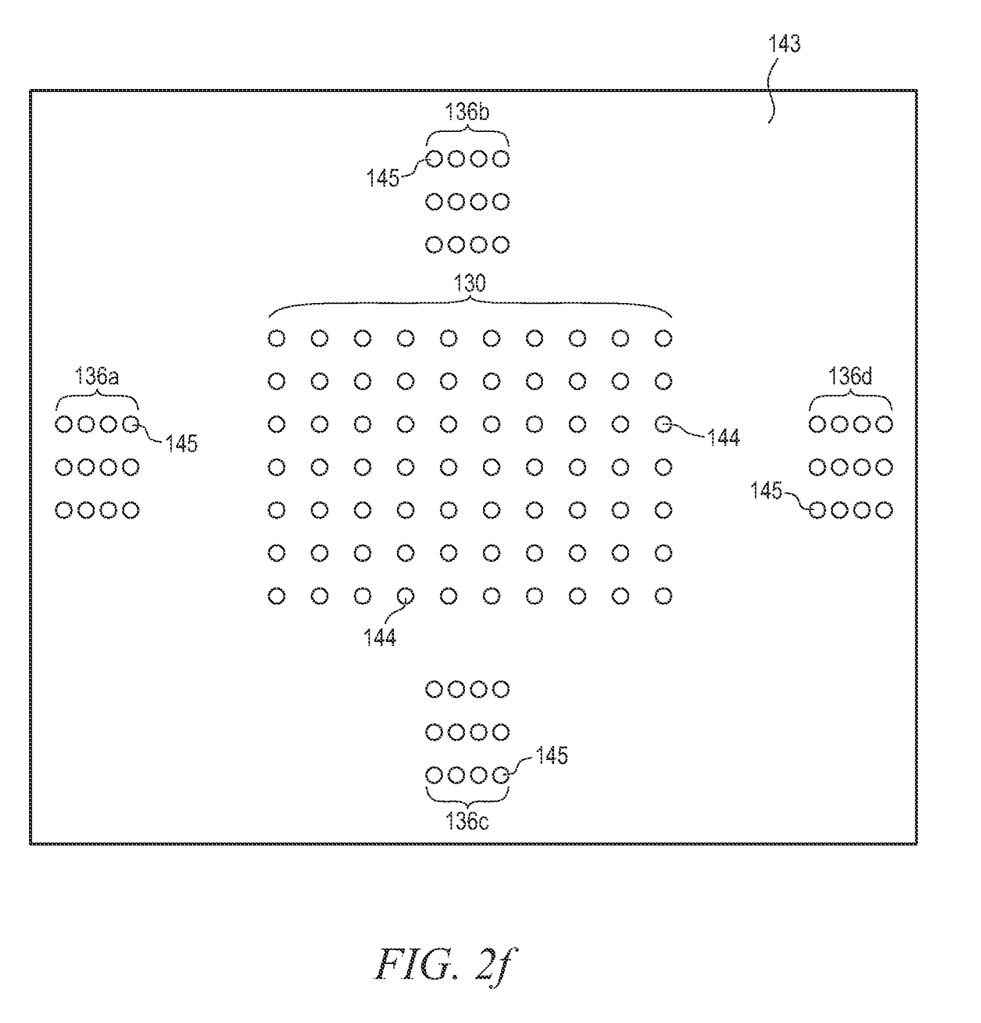

FIG. 2e shows an alternate arrangement of ground pad arrays 136a-136d on surface 126 around component attach area 130. Bumps 132 and bumps 138 can be formed at the same time by the same step with the same processing equipment, e.g., bumps 132 and 138 can be made with one print stencil 143 having a substrate with openings 144, 145 for each of bumps 132 and 138, respectively. FIG. 2f shows print stencil 143 with openings 144 aligned with component attach area 130 in FIG. 2e and openings 145 aligned with ground pad arrays 136a-136d in FIG. 2e. Bumps 132 and 138 can be formed at the same time using the same equipment, i.e., all bumps formed at the same time through openings 144 and 145 in print stencil 143. The process of forming bumps 132 and 138 simultaneously reduces manufacturing costs and simplifies the manufacturing process.

Figure 2G:
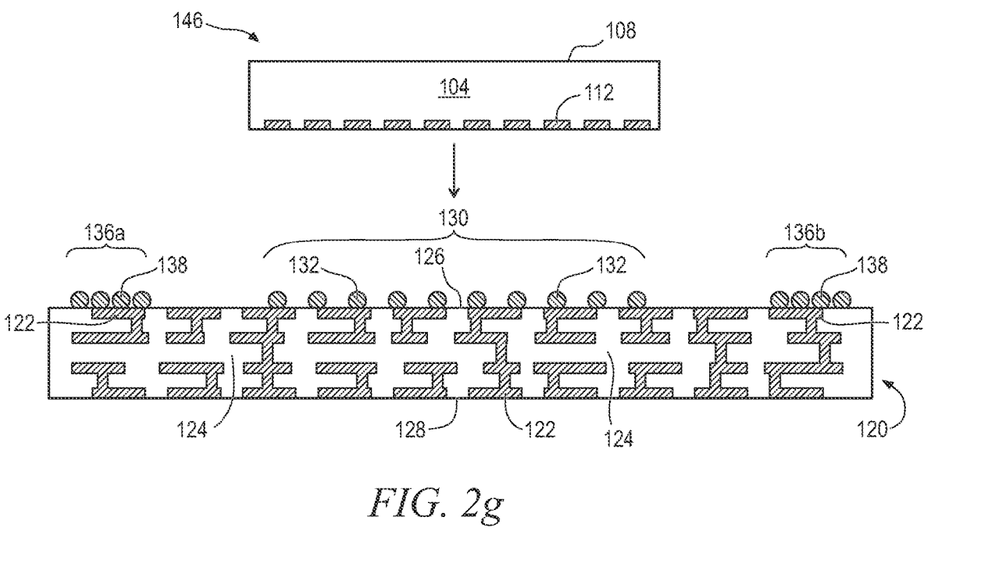
Figure 2H:
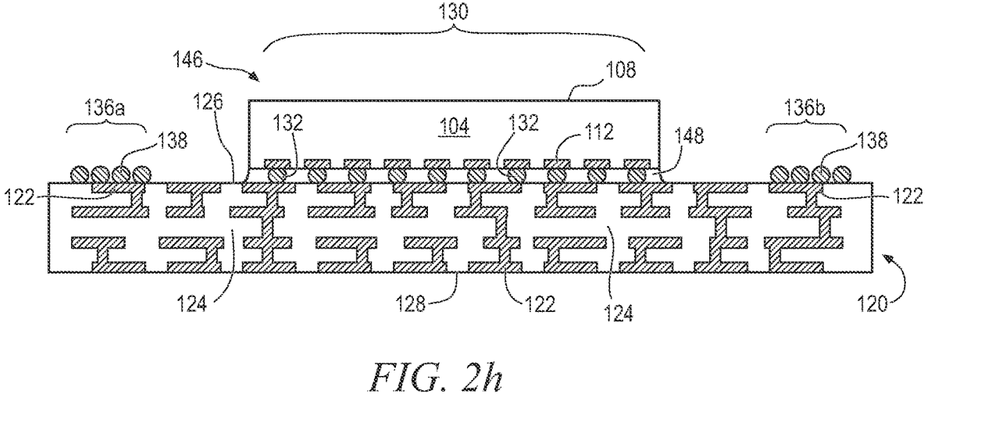

In FIG. 2g, electrical component 146 is mounted to surface 126 of interconnect substrate 120 in component attach area 130 and electrically and mechanically connected to bumps 132 and conductive layer 122. Electrical component 146 is positioned over substrate 120 using a pick and place operation. For example, electrical component 146 can be semiconductor die 104 from FIG. 1c with active surface 110 oriented toward surface 126 of substrate 120 over component attach area 130. Alternatively, electrical component 146 can include other semiconductor die, semiconductor packages, surface mount devices, discrete electrical devices, or IPDs, such as a resistor, capacitor, and inductor. FIG. 2h illustrates electrical component 146 electrically and mechanically connected to bumps 132 and conductive layer 122 of substrate 120. An underfill material 148, such as an epoxy resin, is deposited under electrical component 146.

Electrical component 146 may contain IPDs that are susceptible to or generate EMI, RFI, harmonic distortion, and inter-device interference. For example, the IPDs contained within electrical component 146 provide the electrical characteristics needed for high-frequency applications, such as resonators, high-pass filters, low-pass filters, band-pass filters, symmetric Hi-Q resonant transformers, and tuning capacitors. In another embodiment, electrical component 146 contain digital circuits switching at a high frequency, which could interfere with the operation of IPDs in an adjacent package or module.

Figure 2I:
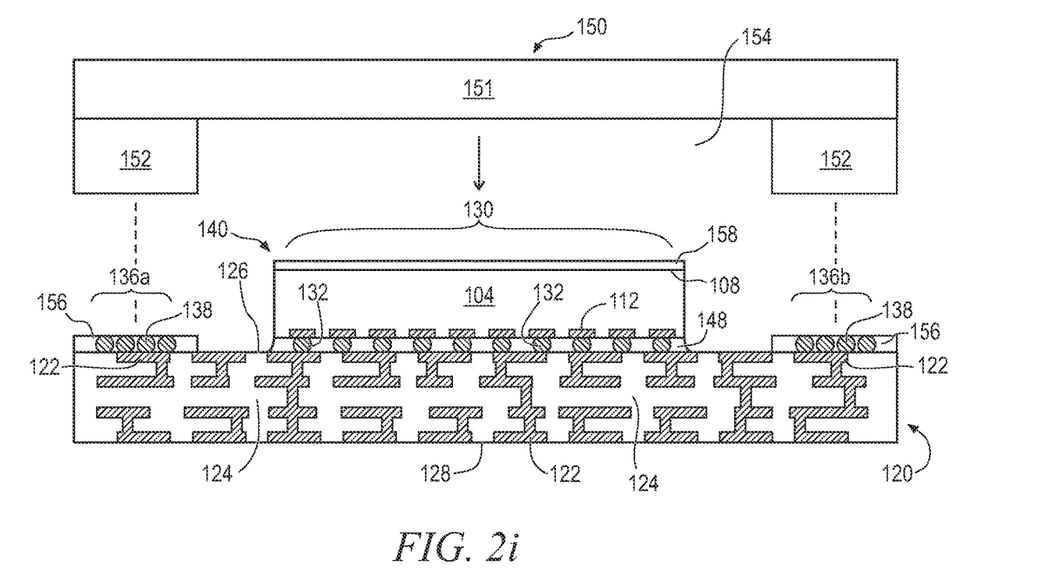

FIG. 2i shows package structure 150 disposed over interconnect substrate 120 and electrical component 146. In one embodiment, package structure 150 includes a material to operate as a heat sink or heat spreader to dissipate heat from electrical component 146. In another embodiment, package structure 150 includes a material to operate as an electromagnetic shielding layer to reduce or inhibit EMI, RFI, and other inter-device interference. In yet another embodiment, package structure 150 includes a material to operate as either or both a heat sink and electromagnetic shielding layer, i.e., heat sink/shielding structure 150. Heat sink/shielding structure 150 can be one or more layers of Al, Cu, Sn, Ni, Au, Ag, or other suitable thermally and electrically conductive material. Alternatively, heat sink/shielding structure 150 can be carbonyl iron, stainless steel, nickel silver, low-carbon steel, silicon-iron steel, foil, conductive resin, carbon-black, aluminum flake, and other metals and composites capable of reducing or inhibiting the effects of heat and/or EMI, RFI, and other inter-device interference.

Figure 2J:
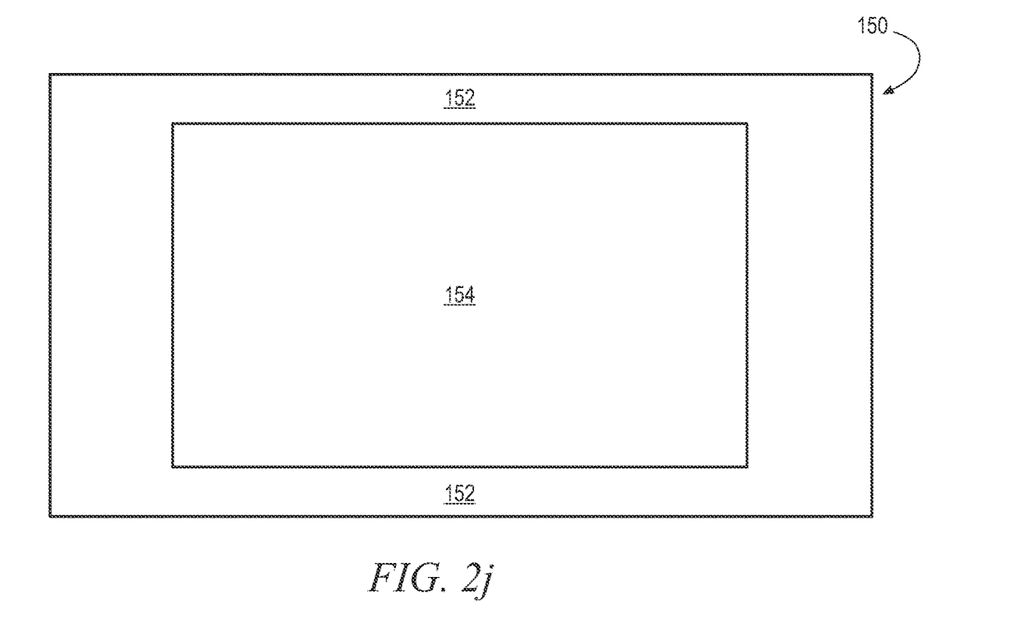

Heat sink/shielding structure 150 includes horizontal member 151 and legs 152 extending on at least two sides from the horizontal member. Alternatively, legs 152 extend around a perimeter of heat sink/shielding structure 150 forming cavity 154. FIG. 2j shows a bottom view of heat sink/shielding structure 150, legs 152, and cavity 154. In FIG. 2i, protection layer 156 is deposited over ground pad arrays 136a-136d to cover bumps 138. In one embodiment, protection layer 156 is an electrically conductive epoxy. A thermal interface material (TIM) 158 is deposited over back surface 108 of electrical component 146. Heat sink/shielding structure 150 is positioned over interconnect substrate 120 with cavity 154 aligned with electrical component 146 and legs 152 aligned with ground pad arrays 136a-136d.

Figure 2K:
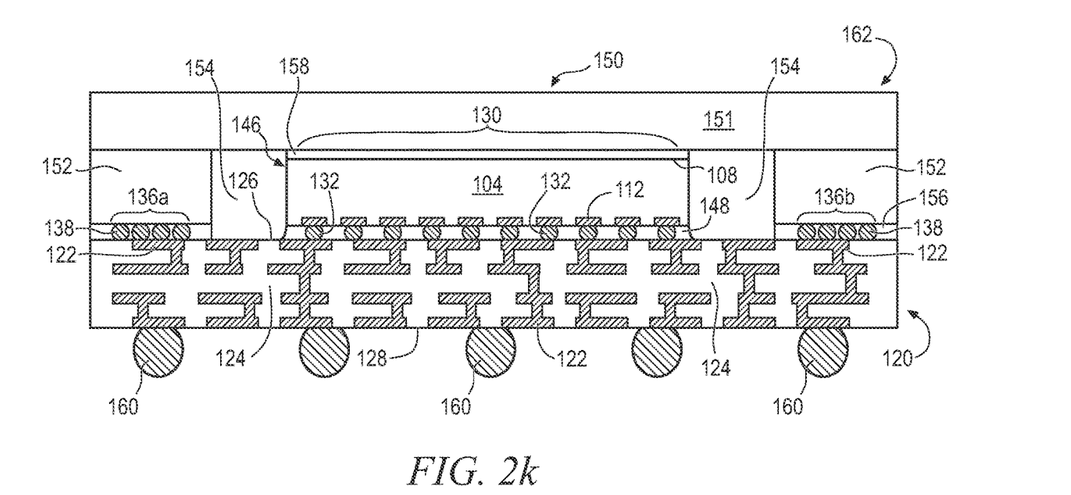

FIG. 2k shows heat sink/shielding structure 150 mounted to interconnect substrate 120 with electrical component 146 disposed at least partially within cavity 154 and legs 152 bonded to surface 126 of interconnect substrate 120 with adhesive 156 in ground pad arrays 136a-136d. Electrical component 146 dissipates heat and other thermal energy through TIM 158 to heat sink/shielding structure 150. Heat sink/shielding structure 150 is electrically connected through legs 152, bumps 138 to conductive layer 122 of interconnect structure to provide a ground for the shielding function. Heat sink/shielding structure 150 shunts charges to ground to reduce or inhibit EMI, RFI, and other inter-device interference. I An electrically conductive bump material is deposited over conductive layer 122 on surface 128 of interconnect substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 160. In one embodiment, bump 160 is formed over a UBM having a wetting layer, barrier layer, and adhesive layer. Bump 160 can also be compression bonded or thermocompression bonded to conductive layer 122. Bump 160 represents one type of interconnect structure that can be formed over conductive layer 122. The interconnect structure can also use bond wires, conductive paste, stud bump, micro bump, or other electrical interconnect.

Figure 3:
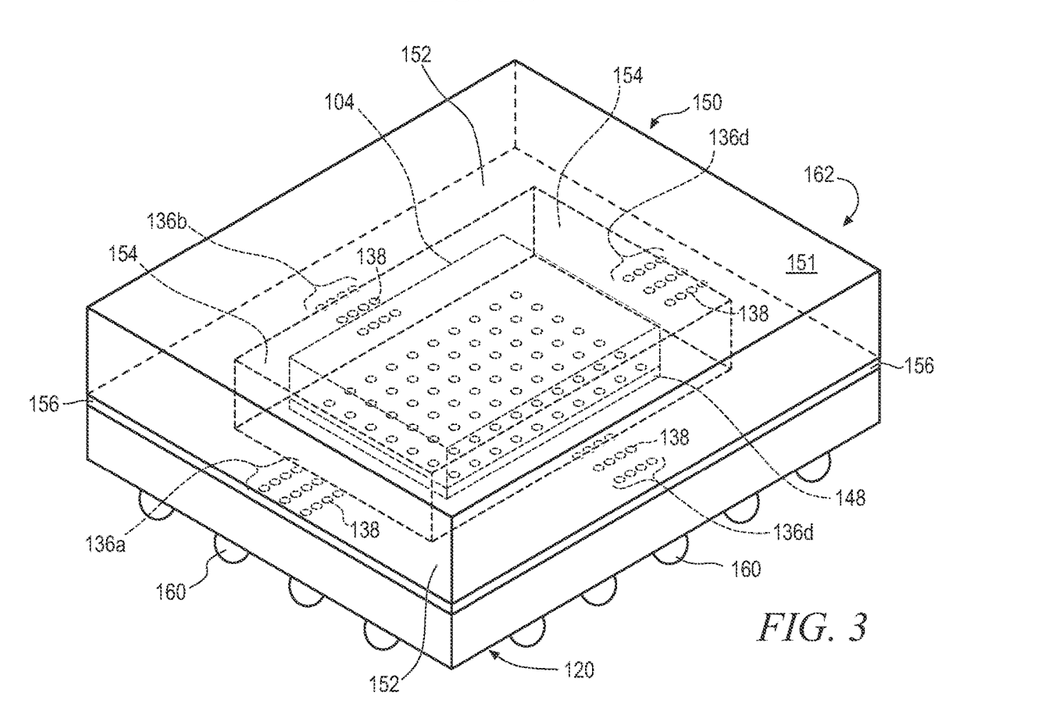
FIG. 3 illustrates a perspective view of a semiconductor package with a bump pad array on a substrate for ground connection of a heat sink/shielding structure.

FIG. 3 illustrates a perspective view of semiconductor package 162 with heat dissipation and RFI/EMI shielding for electrical component 146 by way of heat sink/shielding structure 150. Heat sink/shielding structure 150 is grounded through bumps 138 formed as a two dimensional array in ground pad arrays 136a-136d. Bumps 138 can be made with the same height and width as bumps 132 used to provide electrical interconnect between electrical component 146 and interconnect substrate 120. Accordingly, bumps 132 and bumps 138 can be formed at the same time by the same step with the same processing equipment, e.g., all bumps 132, 138 formed through openings 141, 142 in a single print stencil 140, or through openings 144, 145 in a single print stencil 143. The array format for bumps 132 and 138 allows for easy selection as to the number of bumps and bump pads for both grounding and die interconnect. The array of bumps 138 on ground pad arrays 136a-136d reduce the chance of oxidation around and under the ground connection. The process of forming bumps 132 and 138 simultaneously reduces manufacturing costs and simplifies the manufacturing process.

Figure 4:
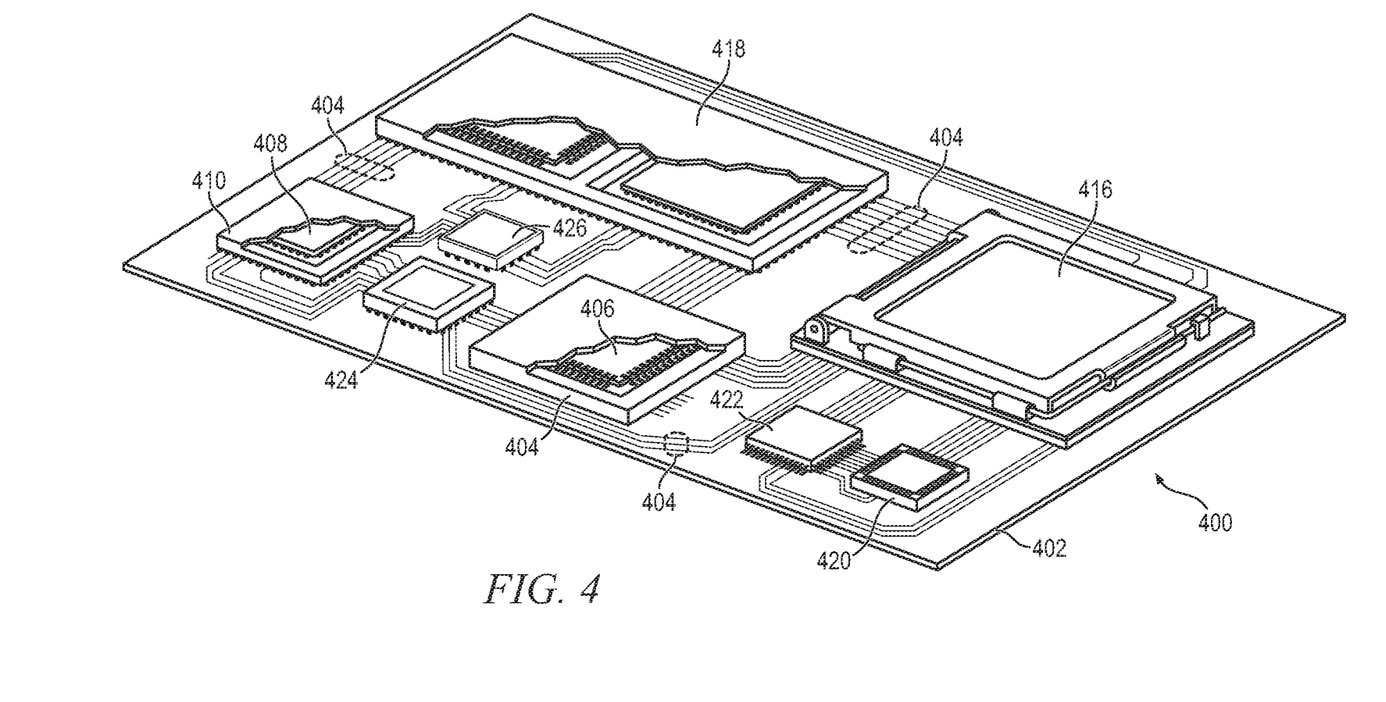
FIG. 4 illustrates a printed circuit board (PCB) with different types of packages mounted to a surface of the PCB.

FIG. 4 illustrates electronic device 400 having a chip carrier substrate or PCB 402 with a plurality of semiconductor packages mounted on a surface of PCB 402, including semiconductor package 162. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet, cellular phone, digital camera, communication system, or other electronic device. Alternatively, electronic device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 4, PCB 402 provides a general substrate for structural support and electrical interconnect of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown mounted on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of forming a semiconductor device, comprising:
   providing a substrate;
   forming a plurality of first bumps over the substrate arranged in a first pattern;
   forming a plurality of second bumps over the substrate in a plurality of second patterns, wherein each of the second patterns is arranged in a two-dimensional array disposed outside and around the first bumps;
   disposing an electrical component over the first bumps; and
   disposing a package structure over the substrate and electrical component with the package structure coupled to the second bumps.

2. The method of claim 1, wherein the first pattern is a first array and the second pattern is a second array.

3. The method of claim 1, wherein the package structure includes a material to operate as a heat sink or shielding layer.

4. The method of claim 3, wherein the shielding layer makes ground connection through the second bumps.

5. The method of claim 1, wherein the first bumps and second bumps have a similar height and width.

6. The method of claim 1, further including disposing a protective layer over the second bumps.

7. A method of forming a semiconductor device, comprising:
   providing a substrate;
   forming a plurality of first bumps over the substrate;
   forming a plurality of second bumps over the substrate, wherein the second bumps are arranged in a two-dimensional array disposed outside the first bumps; and
   disposing a package structure over the substrate with the package structure coupled to the second bumps.

8. The method of claim 7, further including disposing an electrical component over the first bumps.

9. The method of claim 7, wherein the package structure includes a material to operate as a heat sink or shielding layer.

10. The method of claim 9, wherein the shielding layer makes ground connection through the second bumps.

11. The method of claim 7, wherein the first bumps and second bumps have a similar height and width.

12. The method of claim 7, further including disposing a protective layer over the second bumps.

13. A semiconductor device, comprising:
   a substrate;
   a plurality of first bumps formed over the substrate in a first pattern;
   a plurality of second bumps formed over the substrate in a plurality of second patterns, wherein each of the second patterns is arranged in a two-dimensional array disposed outside and around the first bumps; and
   a package structure disposed over the substrate with the package structure coupled to the second bumps.

14. The semiconductor device of claim 13, wherein the first pattern is a first array and the second pattern is a second array.

15. The semiconductor device of claim 13, wherein the package structure includes a material to operate as a heat sink or shielding layer.

16. The semiconductor device of claim 15, wherein the shielding layer makes ground connection through the second bumps.

17. The semiconductor device of claim 13, wherein the first bumps and second bumps have a similar height and width.

18. The semiconductor device of claim 13, further including a protective layer disposed over the second bumps.

19. A semiconductor device, comprising:
   a substrate;
   a plurality of first bumps formed over the substrate;
   a plurality of second bumps formed over the substrate, wherein the second bumps are arranged in a two-dimensional array disposed outside the first bumps; and
   a package structure disposed over the substrate with the package structure making electrical connection through the second bumps.

20. The semiconductor device of claim 19, further including an electrical component disposed over the first bumps.

21. The semiconductor device of claim 19, wherein the plurality of first bumps is arranged in a first array and the plurality of second bumps is arranged in a second array.

22. The semiconductor device of claim 19, wherein the package structure includes a material to operate as a heat sink or shielding layer.

23. The semiconductor device of claim 22, wherein the shielding layer makes ground connection through the second bumps.

24. The semiconductor device of claim 19, further including a protective layer disposed over the second bumps.

25. A semiconductor device, comprising:
   a substrate;
   a plurality of first bumps formed over the substrate in a first pattern;
   a plurality of second bumps formed over the substrate in a second pattern arranged in a two-dimensional array separate from the first pattern; and
   a package structure disposed over the substrate with the package structure making electrical connection through the second bumps.

26. The semiconductor device of claim 25, further including an electrical component disposed over the first bumps.

27. The semiconductor device of claim 25, wherein the first pattern is arranged in a first array and the second pattern is arranged in a second array.

28. The semiconductor device of claim 25, wherein the package structure includes a material to operate as a heat sink or shielding layer.

29. The semiconductor device of claim 28, wherein the shielding layer makes ground connection through the second bumps.

30. The semiconductor device of claim 25, further including a protective layer disposed over the second bumps.

31. The semiconductor device of claim 19, wherein the first bumps are formed over the substrate in a first pattern and the second bumps are formed over the substrate in a second pattern.

* * * * *